July 24, 1962 G. W. REYNOLDS 3,046,363

BILATERAL PARAMETRIC AMPLIFIER

Filed Oct. 23, 1959

INVENTOR.
GEORGE W. REYNOLDS

BY Ostrolenk, Faber, Gerb & Soffen

ATTORNEYS

United States Patent Office 3,046,363

Patented July 24, 1962

3,046,363

BILATERAL PARAMETRIC AMPLIFIER

George W. Reynolds, Corona Del Mar, Calif., assignor to Standard Coil Products Co., Inc., Melrose Park, Ill., a corporation of Illinois Filed Oct. 23, 1959, Ser. No. 848,280
11 Claims. (Cl. 179—170)

The instant invention relates to parametric amplifiers in general and more particularly to a parametric amplifier having bilateral characteristics.

The variable parameter or parametric principle of amplification is characterized by an arrangement in which a variable impedance energy storage element, such as a capacitor or inductor, is coupled to two resonant circuits. If the impedance of the energy storage element is varied in a predetermined manner energy can be transferred from a source driving the energy storage element to the fields of the resonant circuits. The signals derived from the energy source are mixed with the signals to be amplified in a manner such that an extremely low noise figure and a wide bandwidth are obtained.

In general, amplifiers are unilateral devices that is, a signal applied to the input will appear amplified at the output and a signal applied to the output will either not appear at the input or will appear with a greatly reduced magnitude. On the other hand, a bilateral amplifier is capable of accepting signals at either the input or output and producing an amplified signal at the other.

Signals may be applied to both input and output simultaneously and amplification obtained for both signals. However, in this case the two applied signals cannot be at precisely the same frequency.

A bilateral amplifier having a low noise figure and wide bandwidth is suitable for use in a two way data transmission system which utilizes a single cable. This type of bilateral amplifier may also be utilized for two way communication over a single cable without any complicated switching or filtering being required.

Briefly, the device of the instant invention comprises two circuits which are arranged substantially symmetrically about a center tapped signal coupling coil. Each circuit comprises an input-output circuit, tuned to the signal frequency, which feeds a variable impedance energy storage means. In the case illustrated, the energy storage means comprises a semiconductor diode whose impedance, in the operating range chosen, appears as a capacitive reactance which varies as a function of the voltage applied across the diode.

The principal source of voltage variation is obtained from a local oscillator, with the energy of the local oscillator being transferred through the coupling coil to the energy storage means. The signal to be amplified and the local oscillator signal are mixed in the energy storage means with the sum frequency being transferred through the coupling coil to a transfer circuit which is tuned to the sum frequency.

A second mixing operation takes place at the variable impedance storage means of the other symmetrically arranged circuit with the local oscillator and sum frequency signals combining to produce a difference frequency signal which is at the same frequency as the signal to be amplified. This difference frequency appears as the amplified output at the input-output circuit of the latter symmetrically arranged circuit.

In the same manner a signal applied to the input-output circuit of the second symmetrically arranged circuit will appear as an amplified signal at the input-output circuit of the first symmetrically arranged circuit.

Accordingly, a primary object of the instant invention is to provide a novel bilateral amplifier circuit.

Another object is to provide a bilateral amplifier circuit utilizing a variable parameter or parametric principle of amplification.

Still another object is to utilize a semi-conductor diode as a variable impedance storage means in a bilateral parametric amplifier.

The foregoing objects as well as other objects of the instant invention shall become readily apparent after reading the following description of the accompanying drawings in which.

Figure 1:
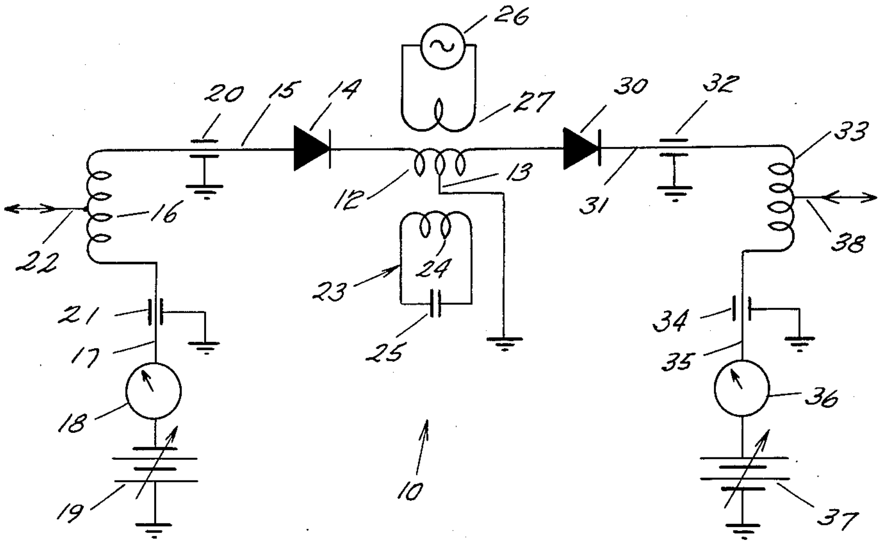
FIGURE 1 is a schematic diagram of the circuit comprising the bilateral parametric amplifier of the instant invention.

Now referring to the figures, bilateral parametric amplifier 10 comprises two substantially identical circuits feeding opposite ends of center tapped signal coupling coil 12 whose center tap 13 is grounded. The circuit connected to the left end of coupling coil 12 comprises a variable impedance energy storage means, in the form of semi-conductor diode 14, having one terminal connected to the left hand end of coupling coil 12 and the other terminal connected through circuit conductor 15 to one terminal of inductor 16 whose other terminal is connected to circuit conductor 17. One terminal of milli-ammeter 18 is connected to circuit conductor 17 and the other terminal is connected to the negative terminal of biasing voltage source 19 whose positive terminal is grounded.

Feed-through capacitors 20, 21 are associated with conductors 15, 17 respectively. The latter capacitor 21 is simply an R.-F. by-pass means which effectivey places the bottom end of inductor 16 at grounded potential for R.-F. purposes. Capacitor 20 is considerably smaller than capacitor 21 and combines with inductor 16 to form an input-output circuit which is tuned to the frequency of the signal which is to be amplified. This signal is applied between tap 22 and inductor 16 and ground.

The signal to be amplified passes from input-output circuit 16, 20 through diode 14 and coupling coil 12 to transfer circuit 23, comprising conductor 24 and capacitor 25. The transfer circuit 23 is tuned to a frequency which is the sum of the signal frequency and the frequency of local oscillator 26 whose energy is transferred through inductor 27 and coupling coil 12 to transfer circuit 23.

The circuit connected to the right hand end of coupling coil 20 is substantially identical to the circuit connected to the left hand end of coupling coil 12 and comprises variable impedance energy storage means in the form of semi-conductor diode 30. One terminal of diode 30 is connected to the right hand end of coupling coil 12 and the other end is connected to circuit conductor 31. Conductor 31 is connected through feed-through capacitor 32 to one end of inductor 33 whose other end is connected to circuit conductor 35 having feed-through capacitor 34 associated therewith. Circuit conductor 35 is connected to one terminal of milli-ammeter 36 whose other terminal is connected to the positive terminal of biasing voltage source 37 having a grounded negative terminal.

Just as feed-through capacitor 21 was and R-F by-pass capacitor so too is feed-through capacitor 34. Capacitor 32 combines with inductor 33 to form an input-output circuit which is tuned to substantially the same frequency as the input-output circuit which is comprised of elements 16 and 20. Not only do feed-through capacitors 20 and 32 function as tuning elements for the input-output circuits but they also act as short circuits to ground for the local oscillator signals. Thus, the local oscillator signals coupled into coil 10 will have two series circuits through which components of current will flow. These circuits comprise diodes 14, 30 and their associated feed-through capacitors 20, 32, respectively.

The sum frequency signal appearing in tuned transfer circuit 23 is transferred out through coupling coil 13 and appears at diode 30 where it is mixed with a signal from local oscillator 26. The difference frequency signal produced by the mixing operation appears as an amplified signal taken between tap 38 of inductor 33 and ground.

Diodes 14 and 30 are of the type manufactured by Hughes Aircraft Company designated HP 2040, which are designed specifically for parametric amplifiers. Each of the diodes has a characteristic such that when it is back biased it behaves as a capacitor with the value of capacitance being a function of the voltage existing across the diode. The diodes are further characterized by exhibiting a low spreading resistance and a relatively small value of back-bias capacitance.

Diodes 14 and 30 are connected in tandem or series aiding relationship. The voltages of biasing sources 19 and 37 are adjusted so that the quiescent D.C. currents flowing through diodes 14 and 30 are in the order of 5 to 10 micro-amperes. With this magnitude of D.C. current flowing, the diodes 14, 30 are operating essentially in the middle of the non-linear voltage capacitance curve illustrated in FIGURE 2. The capacitance of the diodes 14, 30 is varied at the frequency of the signal generated by local oscillator 26. Care must be taken that the voltage sum of the local oscillator and signal to be amplified will not drive the diodes 14, 30 into either forward conduction or Zener breakdown.

Figure 2:
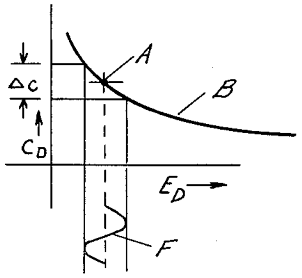
FIGURE 2 is a graph illustrating the variation in capacitance of the energy storage means as a function of voltage applied thereto.

The change in diode capacitance as a function of voltage is best understood by the reference to the graph of FIGURE 2. The biasting voltage sources 19 and 37 are adjacent so that the quiescent D.C. currents flowing through diodes 14, 30 establishes point A on curve B as the operating point about which the capacitance value will vary. The signal voltage F generated by local oscillator 26 causes the capacitance value of diodes 14 and 30 to vary through the range $\Delta C$ about operating point A as a mid point.

In looking at circuit 10 it is seen that there is essentially complete symmetry. Overall experimental results show that if a signal is applied between terminal 22 and ground an amplified version of that signal will appear at terminal 38 and ground. The signal that is coupled in at terminal 22 will appear in tuned transfer circuit 23 as the sum frequency and the gain existing at this point, if no straight parametric amplification is present, is approximately equal to the ratio of the sum of the local oscillator frequency plus the signal frequency divided by the signal frequency.

In an actual experiment the signal frequency was 85 megacycles and the local oscillator frequency was 1000 megacycles. Therefore, under these conditions the theoretical maximum gain existing to the point of transfer circuit 23 was the ratio of 1085 divided by85 which is approximately 13. However, a certain amount of parametric amplification is present so that the gain of this point is actually greater than the calculated gain. Diode 30 serves primarily as a non-linear capacitance mixer between the local oscillator frequency and the sum frequency appearing in transfer circuit 23 to produce a difference frequency. This difference frequency is then coupled into input-output circuit 32, 33 to appear as output at terminal 38. The portion of the circuit to the right of transfer circuit 23 should have a down-conversion loss that is approximately equal to the up-conversion gain existing in the circuit to the left of transfer circuit 23. The fact that gain exists for the overall circuit is due to the fact that some of the lower side band, that is the local oscillator frequency minus the signal frequency exists and this causes parametric amplification to be present thus giving more gain between input 22 and transfer circuit 23 than is predicted in theory. The overall gain, as measured in the laboratory for the described circuit, was on the order of two corresponding to a voltage gain of approximately 6 db.

Insofar as critical frequencies are concerned in the bilateral parametric amplifier, the frequencies applied at the two input terminals 22, 38 cannot be identical. The proximity of the two frequencies is determined by the selectivity of the devices which are used at the two respective output terminals to separate the signals. Using specific numbers, if an 83 mc. modulated signal of 3 mc. bandwidth is applied at terminal 22, it will appear at terminal 38 in an amplified form, and if at terminal 38 we have a modulated signal of 87 mc., it will appear at terminal 22 in an amplified form, and at each terminal a device which has sufficient selectivity to separate the side bands of the 83 mc. modulated signal and the 87 mc. modulated signal must be used.

Although I have here described preferred embodiment of my novel invention, many variations and modifications will now be apparent to those skilled in the art, and I therefore prefer to be limited, not by the specific disclosure herein, but only by the appending claims.

I claim:

1. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; said first input-output circuit comprising means tuned to a first frequency, said local oscillator being tuned to a second frequency, and said transfer means comprising means tuned to a third frequency which is the sum of said first and said second frequencies.

2. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; each of said variable impedance energy storage means comprising a semiconductor means.

3. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; each of said variable impedance energy storage means comprising a semiconductor means; each of said semi-conductor means constructed to present a capacitive reactance which varies as a function of voltage applied to said semi-conductor means.

4. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; each of said variable impedance energy storage means comprising a semi-conductor means; each of said semi-conductor means constructed to present a capacitive reactance which varies as a function of voltage applied to said semi-conductor means; each of said semi-conductor means comprising a diode; said diodes being connected in series aiding relationship.

5. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; each of said variable impedance energy storage means comprising a semiconductor means; each of said semi-conductor means constructed to present a capacitive reactance which varies as a function of voltage applied to said semi-conductor means; each of said semi-conductor means comprising a diode; said diodes being connected in series aiding relationship; means supplying a D.C. quiescent operating current for both of said diodes.

6. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; each of said variable impedance energy storage means comprising a semi-conductor means; each of said semi-conductor means constructed to present a capacitive reactance which varies as a function of voltage applied to said semi-conductor means; each of said semi-conductor means comprising a diode; said diodes being connected in series aiding relationship; means supplying a D.C. quiescent operating current for both of said diodes; said coupling device comprising a coil having a center-tap; conductor means connected to said center-tap and forming a portion of a circuit for the D.C. quiescent operating currents of said diodes.

7. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; each of said variable impedance energy storage means comprising a semiconductor means; each of said semi-conductor means constructed to present a capacitive reactance which varies as a function of voltage applied to said semi-conductor means; each of said semi-conductor means comprising a diode; said diodes being connected in series aiding relationship; means supplying a D.C. quiescent operating current for both of said diodes; said coupling device comprising a coil having a center-tap; conductor means connected to said center-tap and forming a portion of a circuit for the D.C. quiescent operating currents of said diodes; each of said input-output circuits comprising a tuned circuit including a feed-through capacitor as a tuning element thereof.

8. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; said first input-output circuit comprising means tuned to a first frequency, said local oscillator being tuned to a second frequency, and said transfer means comprising means tuned to a third frequency which is the sum of said first and said second frequencies; each of said variable impedance energy storage means comprising a semi-conductor means.

9. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit, a second variable impedance energy storage means interposed between said coupling device and said second signal input-output circuit, a local oscillator means operatively positioned to supply energy to said coupling device, and a transfer means operatively positioned to receive energy from and transfer energy to said coupling device; said first input-output circuit comprising means tuned to a first frequency, said local oscillator being tuned to a second frequency, and said transfer means comprising means tuned to a third frequency which is the sum of said first and said second frequencies; each of said variable impedance energy storage means comprising a semi-conductor means; said coupling device comprising a center-tapped coil.

10. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; said first input-output circuit comprising means tuned to a first frequency, said local oscillator being tuned to a second frequency, and said transfer means comprising means tuned to a third frequency which is the sum of said first and said second frequencies; each of said variable impedance energy storage means comprising a semi-conductor means; each of said semi-conductor means constructed to present a capacitive reactance which varies as a function of voltage applied to said semi-conductor means.

11. An amplifier for transmitting signals with gain in both a forward and a reverse direction; said amplifier comprising a first signal input-output circuit for input signals in said forward direction and output signals in said reverse direction, a second signal input-output circuit for input signals in said reverse direction and output signals in said forward direction, and circuit means extending between said input-output circuits; said circuit means comprising a signal coupling device, a first variable impedance energy storage means interposed between said coupling device and said first input-output circuit a second variable impedance energy storage means interposed between said coupling device and said second signal input-output circuit, a local oscillator means operatively positioned to supply energy to said coupling device, and a transfer means operatively positioned to receive energy from and transfer energy to said coupling device; said first input-output circuit comprising means tuned to a first frequency, said local oscillator being tuned to a second frequency, and said transfer means comprising means tuned to a third frequency which is the sum of said first and said second frequencies; each of said variable impedance energy storage means comprising a semi-conductor means; each of said semi-conductor means constructed to present a capacitive reactance which varies as a function of voltage applied to said semi-conductor means; each of said semi-conductor means comprising a diode; said diodes being connected in series opposing relationship; means supplying a D.C. quiescent operating current for both of said diodes; said coupling device comprising a coil having a center-tap; conductor means connected to said center-tap and forming a portion of a circuit for the D.C. quiescent operating currents of said diodes.

References Cited in the file of this patent

UNITED STATES PATENTS

| | | |
|---|---|---|
| 2,666,816 | Hunter | Jan. 19, 1954 |
| 2,850,585 | Green | Sept. 2, 1958 |